United States Patent
Zhu et al.

(10) Patent No.: US 11,018,155 B2
(45) Date of Patent: May 25, 2021

(54) VERTICAL STRING OF MEMORY CELLS INDIVIDUALLY COMPRISING A PROGRAMMABLE CHARGE STORAGE TRANSISTOR COMPRISING A CONTROL GATE AND A CHARGE STORAGE STRUCTURE AND METHOD OF FORMING A VERTICAL STRING OF MEMORY CELLS INDIVIDUALLY COMPRISING A PROGRAMMABLE CHARGE STORAGE TRANSISTOR COMPRISING A CONTROL GATE AND A CHARGE STORAGE STRUCTURE

(71) Applicant: Micron Technology, Inc., Boise, ID (US)

(72) Inventors: Hongbin Zhu, Boise, ID (US); Charles H. Dennison, Meridian, ID (US); Gordon A. Haller, Boise, ID (US); Merri L. Carlson, Boise, ID (US); John D. Hopkins, Meridian, ID (US); Jia Hui Ng, Singapore (SG); Jie Sun, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/812,938

(22) Filed: Mar. 9, 2020

(65) Prior Publication Data
US 2020/0212065 A1  Jul. 2, 2020

Related U.S. Application Data

(62) Division of application No. 16/106,693, filed on Aug. 21, 2018, now Pat. No. 10,622,374, which is a
(Continued)

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/02282* (2013.01); *H01L 21/31111* (2013.01);
(Continued)

(58) Field of Classification Search
CPC ......... H01L 27/11582; H01L 27/11556; H01L 21/31111; H01L 21/02282;
(Continued)

(56) References Cited

U.S. PATENT DOCUMENTS 9,748,265 B1 * 8/2017 Lee ..................... H01L 23/5329
2011/0065270 A1 * 3/2011 Shim ................. H01L 27/11582
438/589
(Continued)

*Primary Examiner* — Mouloucoulaye Inoussa
(74) *Attorney, Agent, or Firm* — Wells St. John P.S.

(57) ABSTRACT

A method of forming a vertical string of memory cells comprises forming a lower stack comprising first alternating tiers comprising vertically-alternating control gate material and insulating material. An upper stack is formed over the lower stack, and comprises second alternating tiers comprising vertically-alternating control gate material and insulating material having an upper opening extending elevationally through multiple of the second alternating tiers. The lower stack comprises a lower opening extending elevationally through multiple of the first alternating tiers and that is occluded by occluding material. At least a portion of the upper opening is elevationally over the occluded lower opening. The occluding material that occludes the lower opening is removed to form an interconnected opening comprising the unoccluded lower opening and the upper opening. Charge storage material is deposited into the interconnected opening for the charge storage structures for the memory cells of the vertical string that are in each of the
(Continued)

upper and lower stacks and thereafter tunnel insulator and channel material are formed into the interconnected opening for the memory cells of the vertical string that are in each of the upper and lower stack. Other embodiments are disclosed, including embodiments independent of method.

6 Claims, 8 Drawing Sheets

Related U.S. Application Data division of application No. 15/229,490, filed on Aug. 5, 2016, now Pat. No. 10,090,318.

(51) Int. Cl.
| | | |
|---|---|---|
| *H01L 21/311* | (2006.01) | |
| *H01L 21/02* | (2006.01) | |
| *H01L 29/788* | (2006.01) | |
| *H01L 21/28* | (2006.01) | |
| *H01L 29/792* | (2006.01) | |

(52) U.S. Cl.
CPC .. *H01L 27/11556* (2013.01); *H01L 29/40114* (2019.08); *H01L 29/40117* (2019.08); *H01L 29/7883* (2013.01); *H01L 29/7889* (2013.01); *H01L 29/7926* (2013.01)

(58) Field of Classification Search
CPC ......... H01L 29/40114; H01L 29/40117; H01L 29/7889; H01L 29/7883; H01L 29/7926; H01L 27/1157; H01L 21/28273; H01L 27/11529; H01L 21/3205; G11C 16/0475; G11C 16/04; G11C 16/14; G11C 16/3445; G11C 16/26
USPC ......... 257/324, 314, E21.645; 438/268, 667, 438/261, 595, 761, 589; 365/185.22, 365/185.18
See application file for complete search history.

(56) References Cited

U.S. PATENT DOCUMENTS

| | | | | |
|---|---|---|---|---|
| 2011/0312174 | A1* | 12/2011 | Lee | H01L 27/11582 438/595 |
| 2012/0003800 | A1* | 1/2012 | Lee | H01L 27/11578 438/261 |
| 2013/0277731 | A1* | 10/2013 | Goda | H01L 27/11556 257/324 |
| 2016/0104717 | A1* | 4/2016 | Lu | H01L 27/11556 365/185.22 |
| 2016/0190155 | A1* | 6/2016 | Lee | H01L 27/11565 438/268 |
| 2016/0204117 | A1* | 7/2016 | Liu | H01L 27/11551 257/324 |
| 2016/0225621 | A1* | 8/2016 | Seo | H01L 29/04 |

* cited by examiner

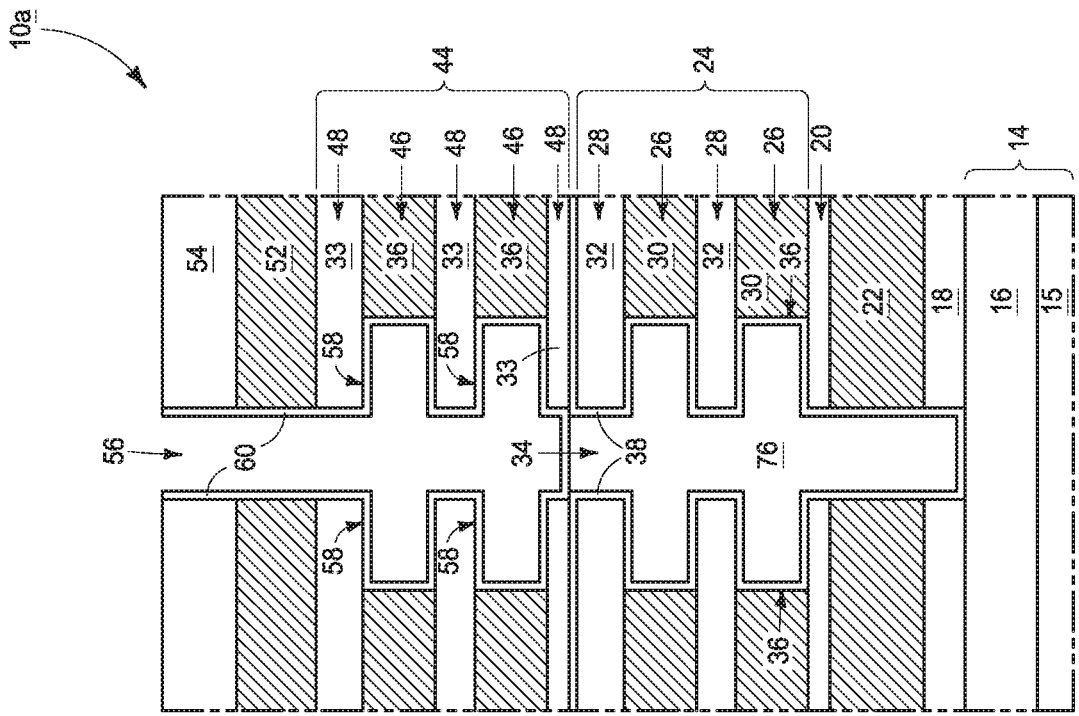
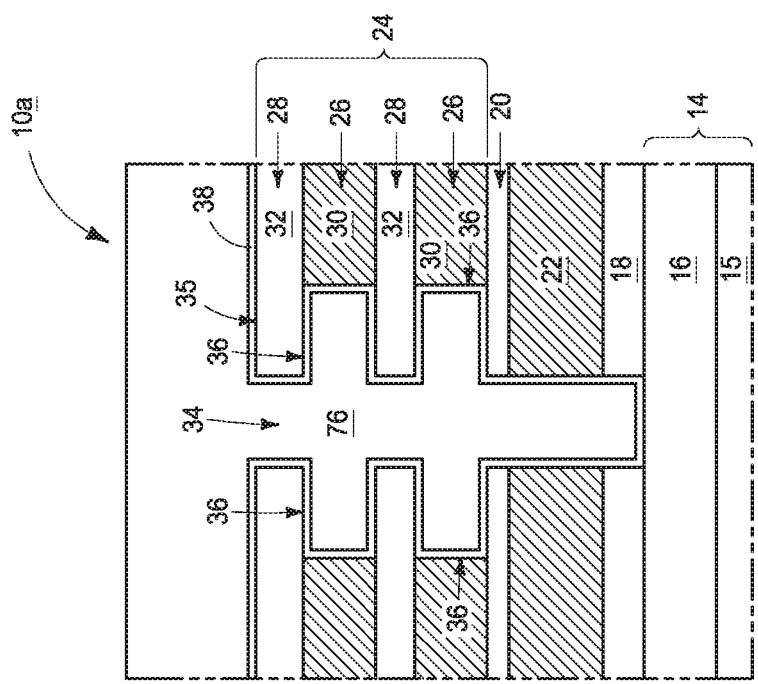

VERTICAL STRING OF MEMORY CELLS INDIVIDUALLY COMPRISING A PROGRAMMABLE CHARGE STORAGE TRANSISTOR COMPRISING A CONTROL GATE AND A CHARGE STORAGE STRUCTURE AND METHOD OF FORMING A VERTICAL STRING OF MEMORY CELLS INDIVIDUALLY COMPRISING A PROGRAMMABLE CHARGE STORAGE TRANSISTOR COMPRISING A CONTROL GATE AND A CHARGE STORAGE STRUCTURE

RELATED PATENT DATA

This patent resulted from a divisional application of U.S. patent application Ser. No. 16/106,693, filed Aug. 21, 2018, entitled "Vertical String Of Memory Cells Individually Comprising A Programmable Charge Storage Transistor Comprising A Control Gate And A Charge storage Structure And Method Of Forming A Vertical String Of Memory Cells Individually Comprising A Programmable Charge Storage Transistor Comprising A Control Gate And A Charge Storage Structure", naming Hongbin Zhu, Charles H. Dennison, Gordon A. Haller, Merri L. Carlson, John D. Hopkins, Jia Hui Ng, and Jie Sun as inventors, which was a divisional application of U.S. patent application Ser. No. 15/229,490, filed Aug. 5, 2016, entitled "Vertical String Of Memory Cells Individually Comprising A Programmable Charge Storage Transistor Comprising A Control Gate And A Charge storage Structure And Method Of Forming A Vertical String Of Memory Cells Individually Comprising A Programmable Charge Storage Transistor Comprising A Control Gate And A Charge Storage Structure", naming Hongbin Zhu, Charles H. Dennison, Gordon A. Haller, Merri L. Carlson, John D. Hopkins, Jia Hui Ng, and Jie Sun as inventors, now U.S. Pat. No. 10,090,318, the disclosures of which are incorporated by reference.

TECHNICAL FIELD

Embodiments disclosed herein pertain to vertical strings of memory cells individually comprising a programmable charge storage transistor comprising a control gate and a charge storage structure and to methods of forming such vertical strings of memory cells.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Flash memory cell strings have historically been arranged to extend horizontally, although vertically extending memory cell strings are now being considered. One goal in fabrication of vertical memory cell strings is to reduce the horizontal area of the substrate occupied by the memory cells as compared to horizontally extending memory cell strings, albeit typically at the expense of increased vertical thickness. Nevertheless, vertically orienting memory cell strings can create horizontal packing density considerations not present in horizontally oriented memory cell string layouts.

BRIEF DESCRIPTION OF THE DRAWINGS

FIG. 11 is a diagrammatic sectional view of a substrate fragment in process in accordance with an embodiment of the invention.

FIG. 12 is a view of the FIG. 11 substrate at a processing step subsequent to that shown by FIG. 11.

DETAILED DESCRIPTION OF EXAMPLE EMBODIMENTS

Embodiments of the invention encompass a vertical string of memory cells individually comprising a programmable charge storage transistor comprising a control gate and a charge storage structure and methods of forming a vertical string of memory cells individually comprising a programmable charge storage transistor comprising a control gate and a charge storage structure. In this document, "horizontal" refers to a general direction (i.e., within 10 degrees) along a primary surface relative to which a substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational(ly)", "higher", "upper", "lower", "top", "atop", "bottom", "above, "below", "under", "beneath", "up", and "down" are generally with reference to the vertical direction relative to a base substrate upon which the circuitry is fabricated. Example method embodiments in accordance with the invention are initially described with reference to FIGS. 1-10.

Figure 1:
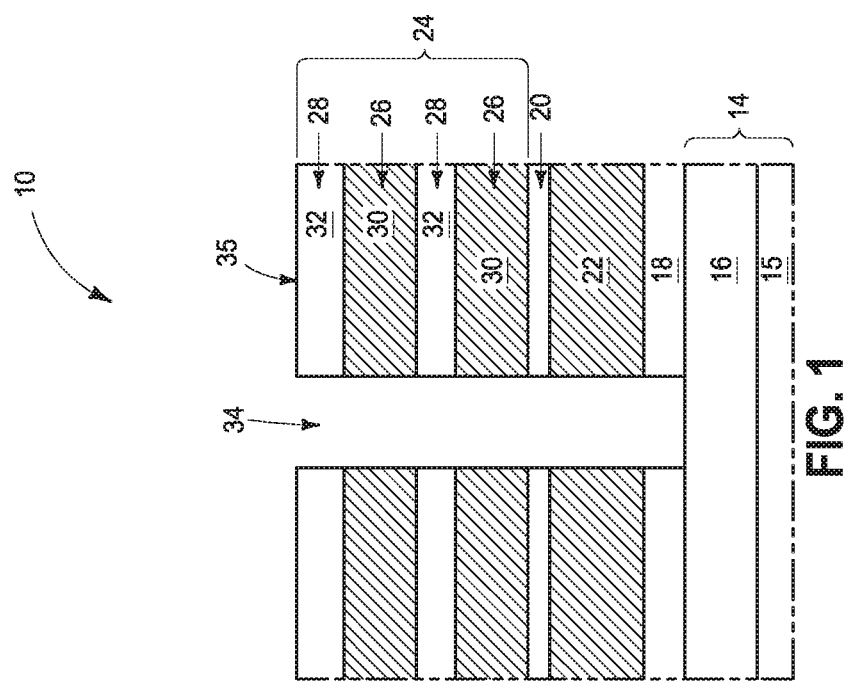
FIG. 1 is a diagrammatic sectional view of a substrate fragment in process in accordance with an embodiment of the invention.

Referring to FIG. 1, a substrate fragment 10 comprises a base substrate 14, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Base substrate 14 may comprise any one or more of conductive/conductor/conducting (i.e., electrically herein), semiconductive, or insulative/insulator/insulating (i.e., electrically herein) materials. Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Example substrate 14 comprises semiconductor material 15, for example monocrystalline-silicon, having a conductively-doped source region 16 formed there-over or therein and which may comprise a portion of circuitry for the vertical string of memory cells being fabricated. An example source region 16 comprises conductively-doped polysilicon of about 700 Angstroms thickness over an underlying layer of tungsten silicide of about 900 Angstroms thickness. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Example dielectric layers 18 and 20 have been formed over source region 16, and gate material 22 is elevationally there-between. Gate material 22 may ultimately comprise a portion of a select device (e.g., a select gate drain) associated with operating the vertical string of memory cells, and may comprise any suitable conductive material. One example is conductively-doped polysilicon. Dielectric layers 18 and 20 may be of the same or different composition(s) relative one another, with doped or undoped silicon dioxide and aluminum oxide being examples. Example thicknesses for materials 18, 22, and 20 are about 200 Angstroms, 1,500 Angstroms, and 150 Angstroms, respectively.

A lower stack of materials 24 has been formed over dielectric material 20. Reference to "lower" is relative to an "upper" stack to be formed subsequently and as described by way of example below. Lower stack 24 comprises first alternating tiers 26 and 28 comprising vertically-alternating control gate material 30 and insulating material 32. Control gate material 30 is ultimately conductive, with an example being conductively-doped polysilicon deposited to an example thickness of about 300 Angstroms. An example insulating material 32 is silicon dioxide deposited to an example thickness of about 150 Angstroms. Only two control gate material 30 layers and two insulating material 32 layers are shown, although dozens and more of such vertically-alternating materials/tiers may be included in lower stack 24. Lower stack 24 includes a lower opening 34 extending elevationally through multiple of first alternating tiers 26 and 28. In the depicted embodiment, lower opening 34 extends elevationally through materials 20, 22, and 18 to source region 16. In one embodiment and as shown, lower opening 34 extends elevationally completely through all tiers of lower stack 24. Lower opening 34 is shown as comprising vertically straight sidewalls although such need and may not be so. Further and regardless, lower opening 34 may be circular, ellipsoidal, rectangular, or of other shape in horizontal cross-section. As but one example, lower opening 34 is substantially circular having a maximum horizontal open dimension of about 800 Angstroms at its elevationally-outermost portion and tapers (not shown) to a horizontal open dimension of about 650 Angstroms at its elevationally-innermost portion where meeting with source region 16. Only one opening 34 is shown in FIG. 1 for clarity and simplicity, although thousands or millions of such openings would likely be formed for ultimate formation of thousands or millions of vertical strings of memory cells. Lower stack 24 may be considered as having an elevationally-outermost surface 35.

Materials may be aside, elevationally inward, or elevationally outward of the FIG. 1-depicted materials. For example, other partially or wholly fabricated components of integrated circuitry may be provided somewhere above, about, or within substrate fragment 10.

Figure 2:
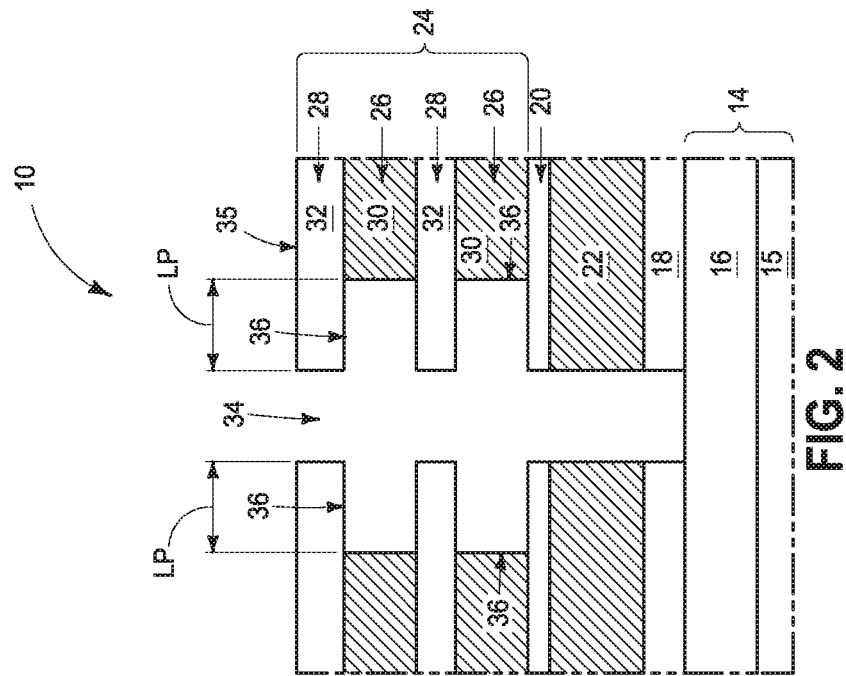
FIG. 2 is a view of the FIG. 1 substrate at a processing step subsequent to that shown by FIG. 1.

Referring to FIG. 2, and in one embodiment, control gate material 30 has been subjected to an isotropic wet etch to laterally recess control gate material 30. Such may be conducted largely selectively relative to materials 32, 20, 22, 18, and 16. In this document, a selective etch or removal is where one material is removed relative to another stated material at a rate of at least 1.5:1. Alternately as an example where little or no removal of materials 32, 20, 22, 18, and 16 is desired, such materials could be covered with a liner material. Regardless, FIG. 2 shows lower opening 34 as comprising lower laterally-outward projecting portions 36 in a vertical cross-section, such as the vertical cross-section shown by FIG. 2. Considered in top view (not shown in FIG. 2) where, for example, original lower opening 34 is circular, projecting portions 36 will likely be circular and annular about initial lower opening 34. An example lateral projecting depth LP is about 800 Angstroms for a maximum horizontal open dimension of about 800 Angstroms for initial lower opening 34.

Figure 3:
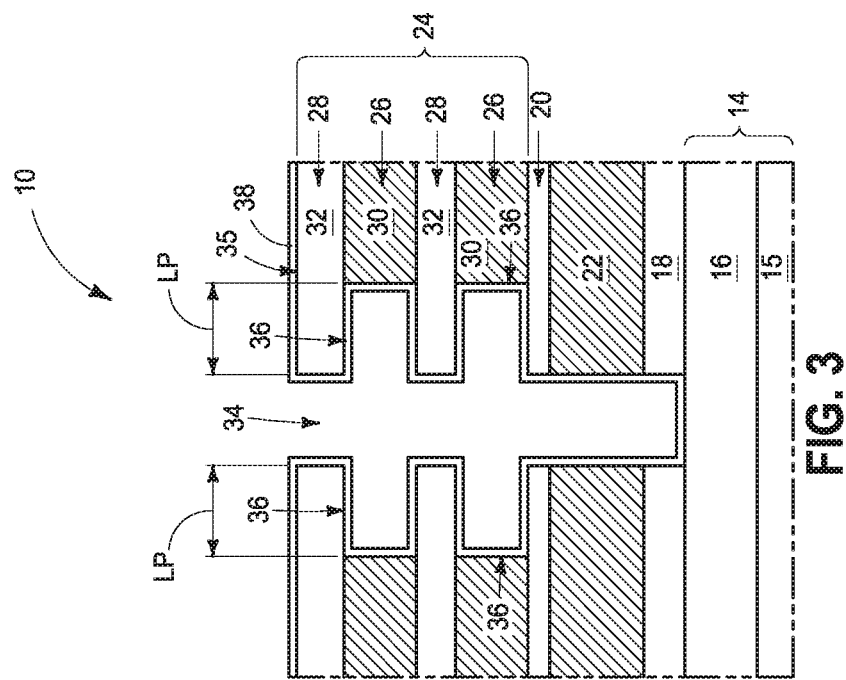
FIG. 3 is a view of the FIG. 2 substrate at a processing step subsequent to that shown by FIG. 2.

Referring to FIG. 3 and in one embodiment, a lower liner 38 has been formed laterally over control gate material 30 within lower opening 34. In one example and as shown, such has been formed by a highly conformal deposition (e.g., ALD or CVD) whereby lower liner 38 lines all surfaces of lower opening 34 and deposits atop elevationally-outermost surface 35 of lower stack 24. Lower liner 38 may comprise any of conductive, semiconductive, or insulative material(s), with one ideal example being silicon nitride. Ideally, lower liner 38 will ultimately be entirely removed from lining the sidewalls of lower opening 34 as described below, although some may remain over such sidewalls and even so may not be necessarily problematic regardless of insulative or conductive composition. An example thickness for lower liner 38 is about 70 Angstroms.

Figure 4:
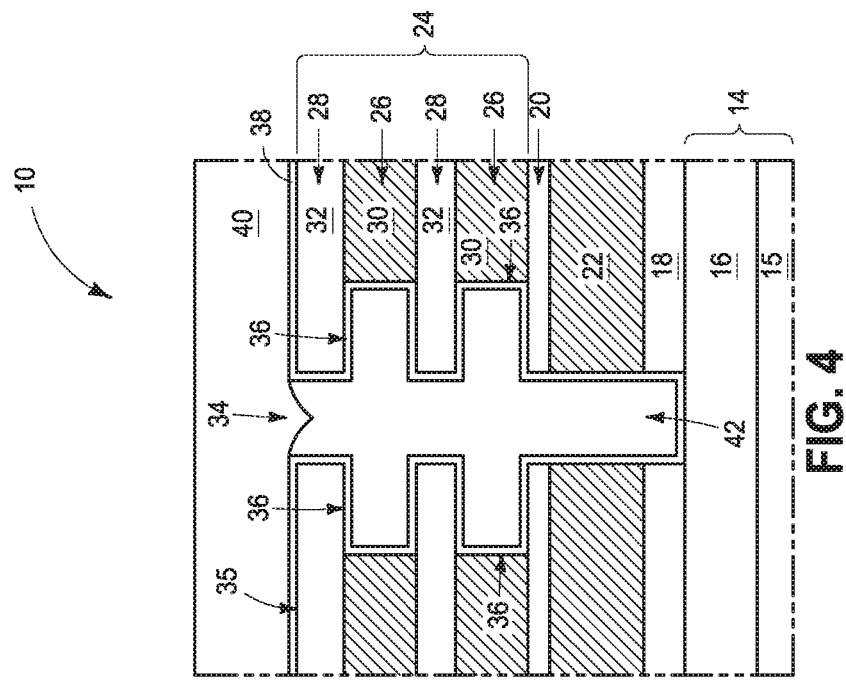
FIG. 4 is a view of the FIG. 3 substrate at a processing step subsequent to that shown by FIG. 3.

Referring to FIG. 4, lower opening 34 has been covered with a covering material 40 to form a covered lower void space 42 (i.e., covering greater than 50% of maximum width of lower opening 34) under covering material 40 from lower opening 34. Some of covering material 40 may deposit into lower void space 42, for example as shown. Ideally in one embodiment, covering material 40 is dielectric and largely non-conformal in deposition to preclude filling or otherwise lining all sidewalls of lower opening 34. Specific examples include silicon dioxide and aluminum oxide deposited to a thickness from about 700 Angstroms to 800 Angstroms. Such may be planarized after deposition, if desired, to produce a planar elevationally-outermost surface thereof as shown. In one embodiment and as shown, covering material 40 is formed to completely cover (i.e., occlude) lower opening 34 and thereby form void space 42 to be completely covered. In one embodiment and as shown, covering material 40 is formed over elevationally-outermost surface 35 of lower stack 24 laterally outward of covered lower void space 42.

Figure 5:
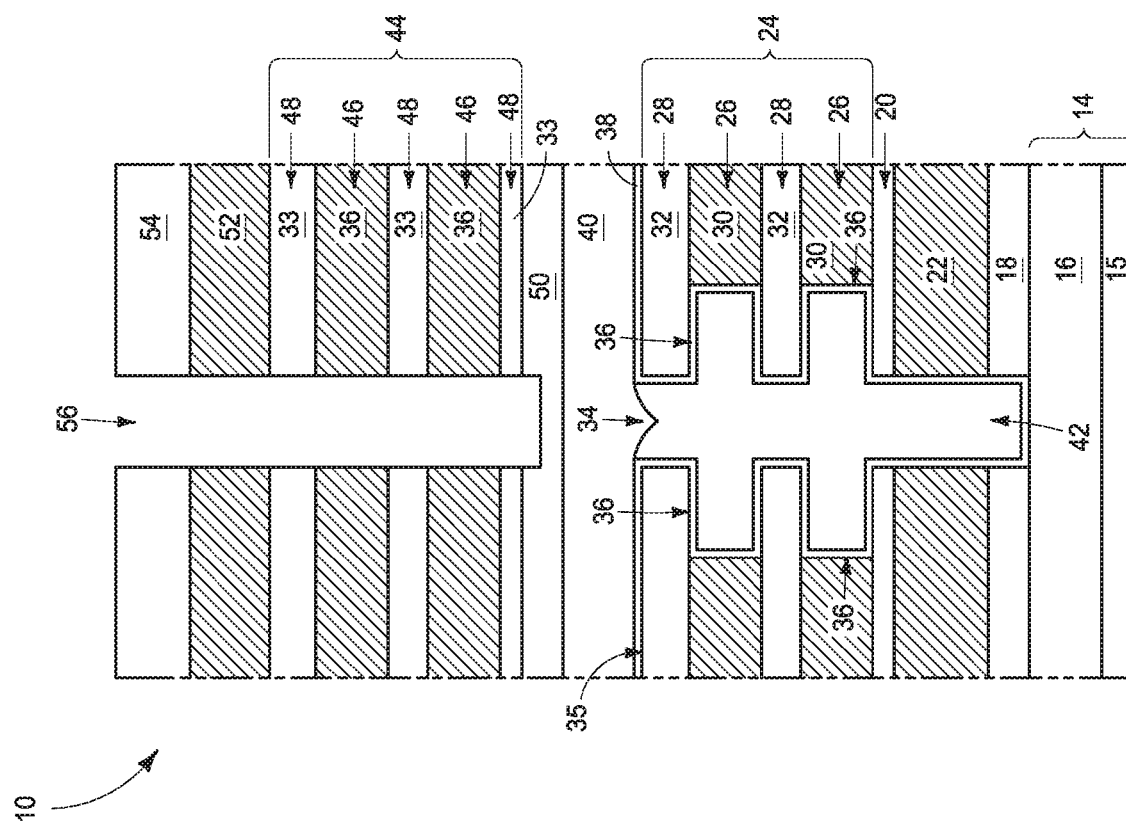
FIG. 5 is a view of the FIG. 4 substrate at a processing step subsequent to that shown by FIG. 4.

Referring to FIG. 5, an upper stack of materials 44 has been formed over lower stack 24 and in one embodiment as shown over covering material 40 and over lower liner 38 that are laterally outward of covered lower void space 42. Upper stack 44 comprises second alternating tiers 46 and 48 comprising vertically-alternating control gate material 36 and insulating material 33. Again, only a few vertically-alternating control gate material 36 layers and insulating material 33 layers are shown for brevity, with likely dozens or more of such material layers being formed within an upper stack 44. Further and regardless, not all control gate materials and insulating materials in each of upper stack 44 and lower stack 24 need be of the same compositions relative one another intra-stack or inter-stack. In one embodiment and as shown, a dielectric etch stop material 50 is between upper stack 44 and covering material 40, with an example being an about 300 Angstroms thick composite layer comprising aluminum oxide over silicon dioxide. Example conductive material 52 (e.g., conductively-doped polysilicon) and dielectric material 54 (e.g., silicon nitride) are shown having been formed over upper stack 44, with conductive material 52 in one example being used subsequently in the formation of another select device (e.g., a select gate source) for operation associated with the vertical string of memory cells being formed. An upper opening 56 has been formed (e.g., by etching) to extend elevationally through multiple of second alternating tiers 46 and 48, for example initially stopping within etch stop layer 50 as shown. At least a portion of upper opening 56 is over covered lower void space 42.

Figure 6:
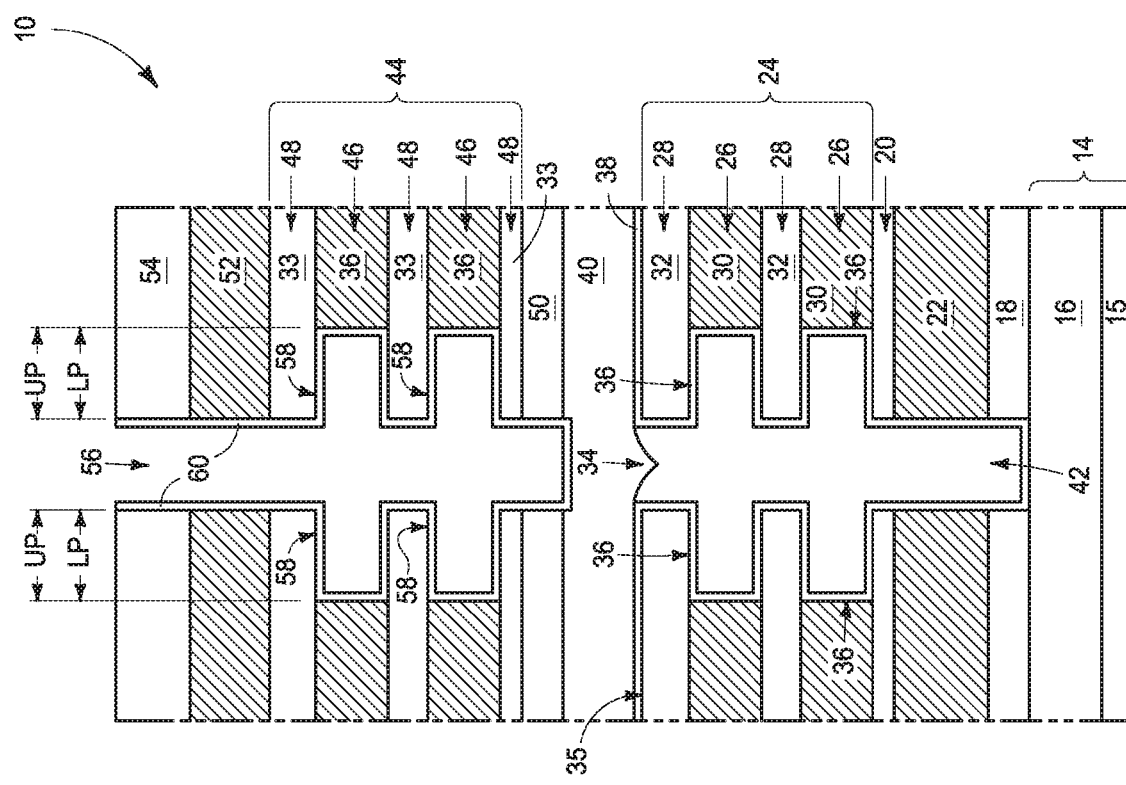
FIG. 6 is a view of the FIG. 5 substrate at a processing step subsequent to that shown by FIG. 5.

Referring to FIG. 6, upper opening 56 has been extended elevationally inward to covering material 40. Control gate material 30 within upper opening 56 has been isotropically wet etched to laterally recess such material to form upper opening 56 to comprise upper laterally-outward projecting portions 58 in the depicted vertical cross-section, analogous to formation of lower laterally-outward projecting portions 36 with respect to lower opening 34 as described above. Upper laterally-outward projecting portions 58 project laterally a distance UP which may be the same, more, or less than one or more of lower laterally-outward projecting portions 36, with equal projecting UP and LP distances being shown by way of example only. An upper liner 60 has been formed laterally over control gate material 36 within upper opening 56, and which may be the same or different composition and thickness as lower liner 38.

Figure 7:
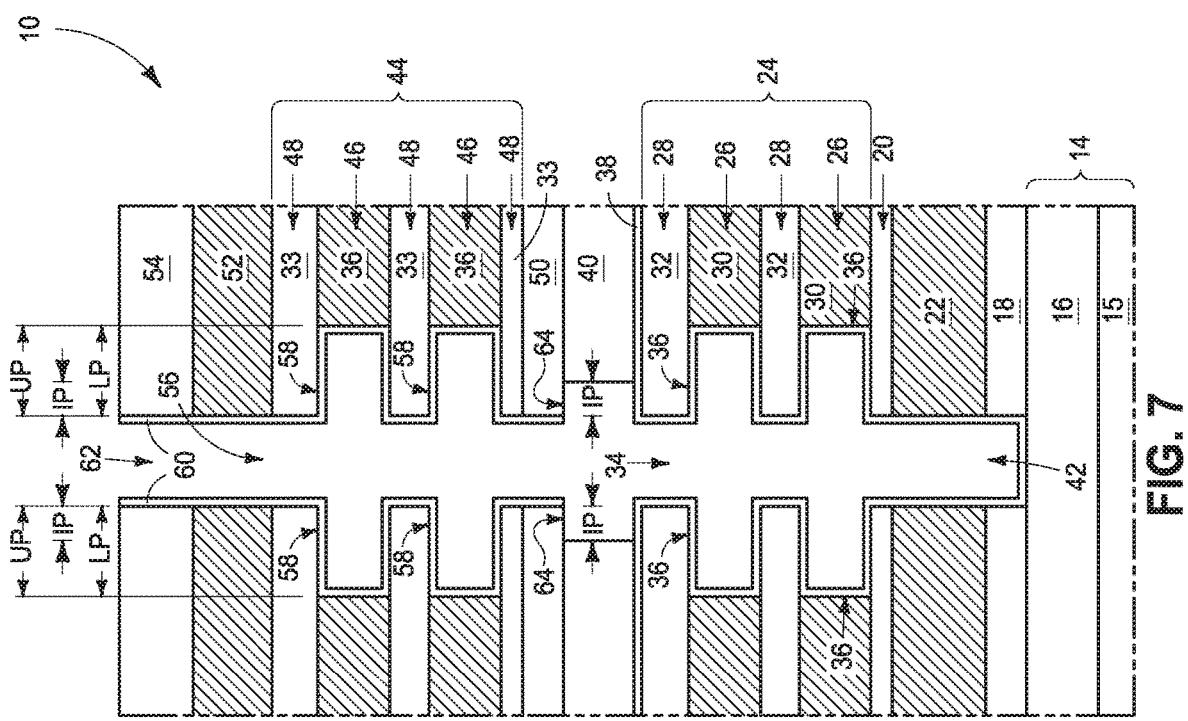
FIG. 7 is a view of the FIG. 6 substrate at a processing step subsequent to that shown by FIG. 6.

Referring to FIG. 7, upper liner 60 has been subjected to an anisotropic etch to remove it from being elevationally over horizontal surfaces of covering material 40. This has been followed by removing covering material 40 to uncover lower void space 42 to form an interconnected opening 62 comprising uncovered lower opening 34 and upper opening 56. Example techniques for doing so include etching, for example one or more of dry and/or wet anisotropic and/or isotropic etching of covering material 40. In one example and as shown, the removing of covering material 40 to form interconnected opening 62 comprises etching that recesses covering material 40 laterally outward to form interconnected opening 62 to have intervening laterally-outward projecting portion 64 elevationally between upper stack 44 and lower stack 24 in vertical cross-section. In one such example embodiment and as shown, intervening projecting portions 64 project laterally a distance IP that is less than each of distances UP and LP of upper projecting portions 58 and lower projecting portions 36, respectively.

Figure 8:
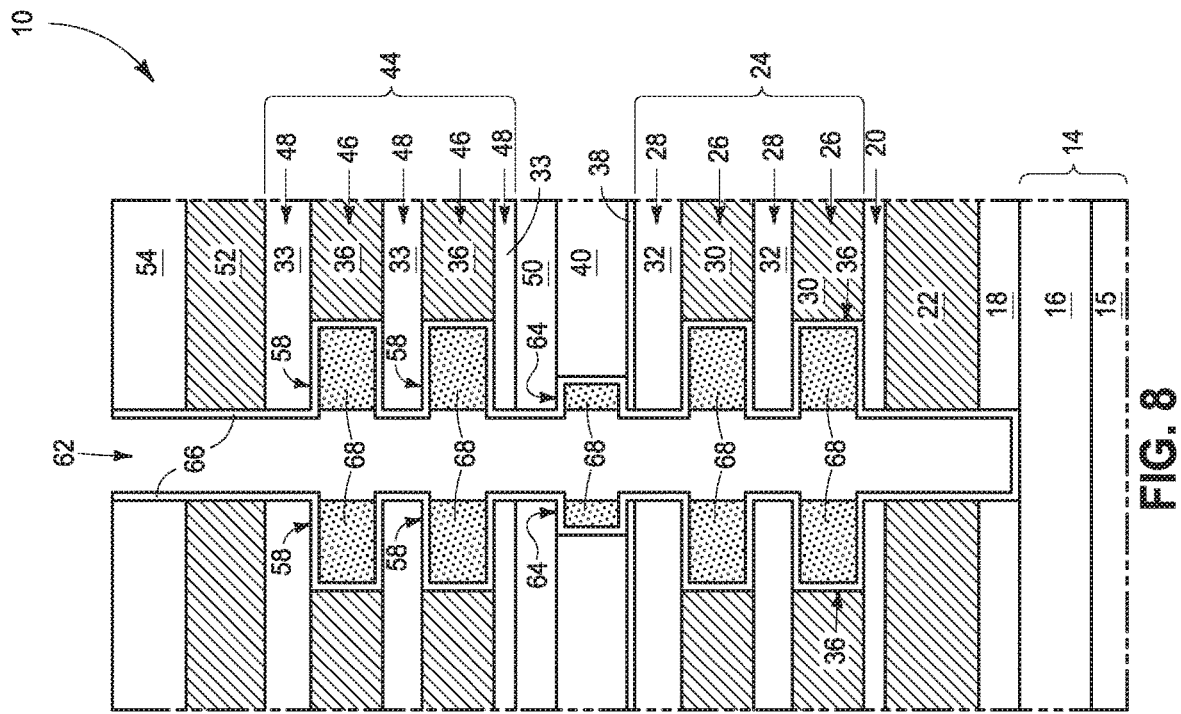
FIG. 8 is a view of the FIG. 7 substrate at a processing step subsequent to that shown by FIG. 7.

Referring to FIG. 8, several acts of processing have occurred relative to FIG. 7. Specifically, upper liner 60 (not shown) and lower liner 38 have been removed from interconnected opening 62 after uncovering the covered lower void space. In one ideal embodiment, upper liner 60 and lower liner 38 are removed from interconnected opening 62 in a single etching step, for example where such comprise the etchably-same material(s), for example silicon nitride which can be wet etched selectively relative to the other depicted materials using any of hot concentrated phosphoric acid, hot ultra-dilute hydrofluoric acid, and/or vapor $NF_3$ and $O_2$. Regardless, charge storage material is deposited into the interconnected opening for the charge storage structures for the memory cells of the vertical string that are in each of the upper and lower stacks. For example, FIG. 8 shows control gate blocking insulator material 66 (e.g., one or more of silicon nitride, silicon dioxide, hafnium oxide, zirconium oxide, etc.) having been formed into interconnected opening 62 and within upper projecting portions 58, intervening projecting portions 64, and lower projecting portions 58 thereof. Charge storage material 68 (e.g., material suitable for utilization in floating gates or charge-trapping structures, such as, for example, one or more of silicon, silicon nitride, nanodots, etc.) has thereafter been deposited into interconnected opening 62 in each of upper stack 44 and lower stack 24, and in one embodiment directly against control gate blocking insulator material 66 that is in projecting portions 58, 64, and 36.

Figure 9:
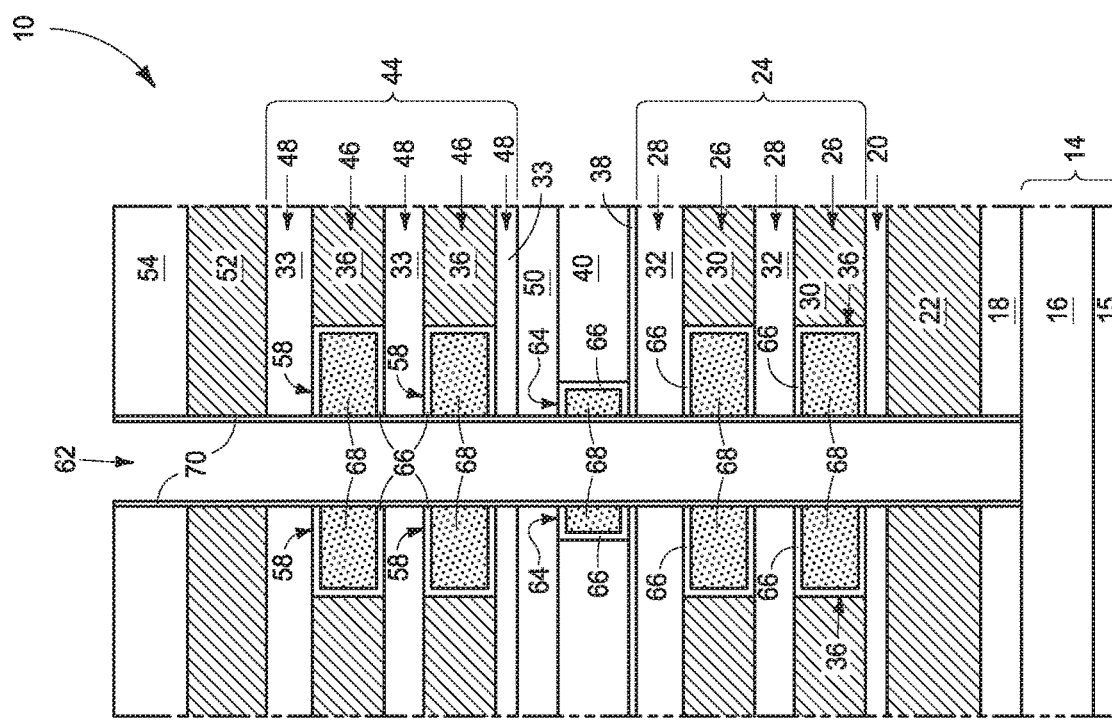
FIG. 9 is a view of the FIG. 8 substrate at a processing step subsequent to that shown by FIG. 8.

Referring to FIG. 9, blocking insulator material 66 has been removed from sidewalls of interconnected opening 62. Tunnel insulator 70 (e.g., one or more of silicon dioxide and silicon nitride) has thereafter been formed into interconnected opening 62.

Figure 10:
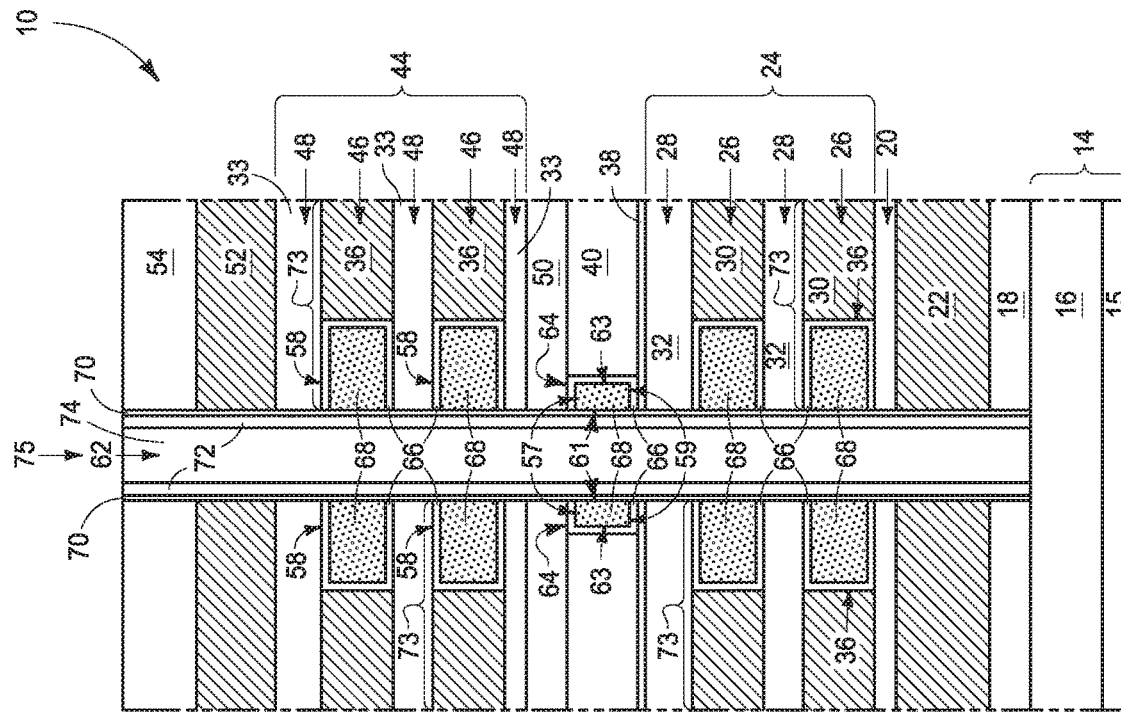
FIG. 10 is a view of the FIG. 9 substrate at a processing step subsequent to that shown by FIG. 9, and is a diagrammatic sectional view of a substrate fragment comprising a vertical string of memory cells in accordance with an embodiment of the invention independent of method of manufacture.

Referring to FIG. 10, channel material 72 has thereafter been formed into interconnected opening 62 for the memory cells of the vertical string that are in each of upper stack 44 and lower stack 24. In one embodiment and as shown, channel material 72 is formed as a hollow channel and having dielectric material 74 formed radially inward thereof. Alternately, non-hollow channels may be used. Channel material 72 ideally comprises doped semiconductive material (e.g., polysilicon) having the channel conductivity-modifying dopant(s) present in a quantity that produces intrinsic semiconductor properties enabling the channel material to operably function as a switchable "on" and "off" channel for the individual memory cells for control gate voltage above and below, respectively, a suitable threshold voltage ($V_t$) depending on programming state of the charge storage transistor for the respective individual memory cell. An example such dopant quantity is from $5\times10^{17}$ atoms/cm$^3$ to $5\times10^{18}$ atoms/cm$^3$. In one embodiment, the channel material has total channel conductivity-modifying dopant(s) present in a quantity no greater than $5\times10^{18}$ atoms/cm$^3$. Regardless, FIG. 10 depicts an example vertical string 75 of individual memory cells 73. Substrate fragment 10 is shown as comprising only two stacks 24 and 44. However, more than two stacks (not shown) may be used in the methods and structures described herein. The construction of a single vertical string may have multiple individual memory cells 73 in each tier 26/46, for example two laterally opposed individual memory cells 73 in the depicted vertical cross section. Alternately, only a single individual memory cell may be in each tier 26/46, for example with the charge storage material forming a completely surrounding annulus that comprises a single memory cell and which has control gate material of a single control line completely surrounding such annular charge storage material.

Additional existing and/or yet-to-be-developed processing would occur in fabrication of array and peripheral control and access circuitry associated with vertical string 75 and which is not particularly material to the inventions described herein. For example, subsequent and additional processing associated with vertical strings of memory cells and components therefore may be occur as described in U.S. Patent Application Publication No. 2015/0279855 and U.S. Patent Application Publication No. 2015/0333143, and which are hereby incorporated by reference herein.

Additional example embodiment methods of forming a vertical string of memory cells individually comprising a programmable charge storage transistor comprising a control gate and a charge storage structure are next described with reference to FIGS. 11-13 with respect to a substrate fragment 10a. Like numerals from the above-described embodiments have been used where appropriate, with some construction differences being indicated with the suffix "a" or with different numerals. Referring to FIG. 11, substrate 10a has been processed the same as in the above-described embodiments up through FIG. 3. Thereafter, a fill material 76 has been formed within lower opening 34. In one embodiment, material of liner material 38 that is within lower opening 34 and fill material 76 may in combination be considered as fill material, and which in one embodiment as shown overfills lower opening 34. Liner 38 may be considered as a first material that lines and less-than-fills lower opening 34, with fill material 76 comprising a second material of different composition from that of the first material, and that is laterally inward of the first material (e.g., liner 38) and fills remaining volume of lower opening 34 that is not occupied by the first material. In one embodiment and as shown, both first material 38 and second material 76 are formed elevationally over elevationally-outermost surface 35 of lower stack 24 laterally outward of lower opening 34. Regardless, in one example embodiment, fill material 76 comprises a spin-on-dielectric which is spun on the depicted substrate and deposited into lower opening 34 thereby.

Referring to FIG. 12, fill material 76 has been removed, for example by polish or etch-back, to an elevationally-outermost surface of first material 38. Thereafter, upper stack 44 has been formed over lower stack 24. Upper stack 44 includes upper opening 56 having been processed, by way of example only, through the processing exemplified by FIGS. 5 and 6, and whereby at least a portion of upper opening 56 is elevationally over filled lower opening 34. Such provides but one example embodiment wherein first material 38 will remain over lower stack 24 laterally outward of lower opening 34 in a finished circuitry construction and second material 76 will not.

Figure 13:
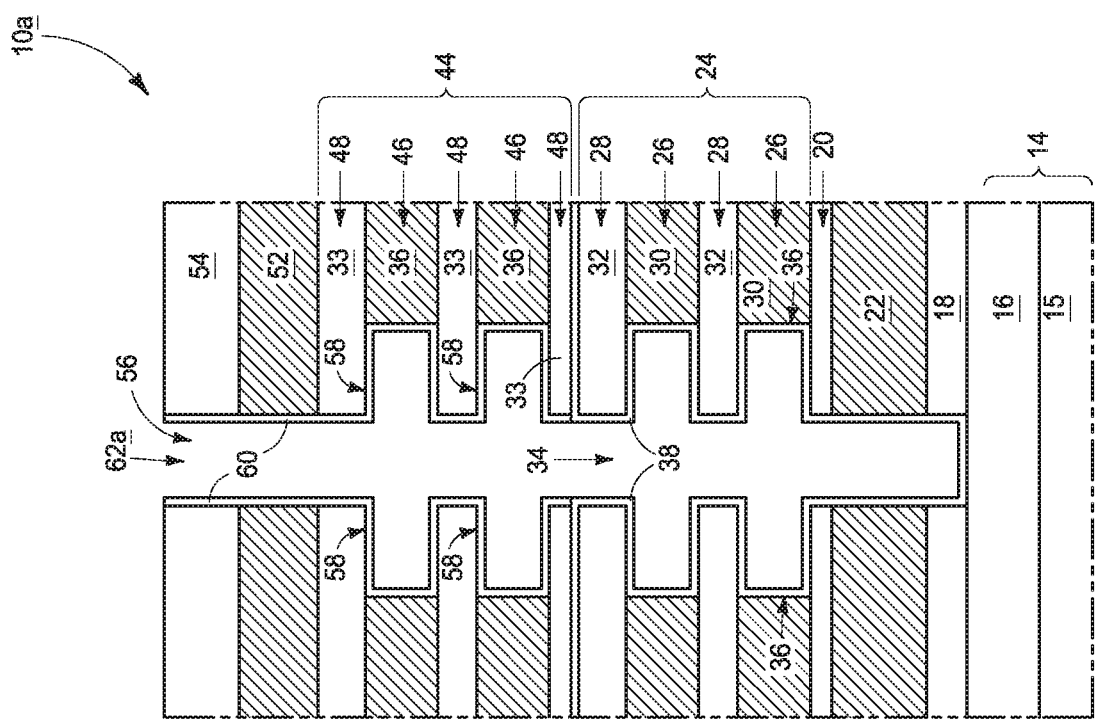
FIG. 13 is a view of the FIG. 12 substrate at a processing step subsequent to that shown by FIG. 12.

Referring to FIG. 13, liner 60 has been removed from over the base of upper opening 56 and fill material 76 (not shown) has been removed from lower opening 34 to form an interconnected opening 62a comprising lower opening 34 and upper opening 56. Thereafter, processing can occur as described above or otherwise whereby as a minimum charge storage material is deposited into the interconnected opening for the charge storage structures for the memory cells of the vertical string that are in each of the upper and lower stacks, followed by formation of tunnel insulator and channel material into the interconnected opening also for the memory cells of the vertical string that are in each of the upper and lower stacks. Processing as described above with respect to FIGS. 11-13 may enable elimination of covering material 40 (not shown) remaining between the upper and lower stacks. Alternately, an intervening example such material may be provided between the upper and lower stacks (not shown in FIGS. 11-13), for example to result in a construction as shown in FIG. 10 or otherwise. Any other attribute(s) or aspect(s) as shown and/or described above may be used.

The above depicted method embodiments commonly are a method of forming a vertical string of memory cells individually comprising a programmable charge storage transistor comprising a control gate and a charge storage structure having the stated upper and lower stacks with upper and lower openings wherein the lower opening is occluded by occluding material. In the FIGS. 1-10 embodiment, covering material 40 is shown as an example occluding material which occludes lower opening 34. Materials 38 and 76 in the embodiment of FIGS. 11-13 also comprise an example such occluding material. Regardless, in each such method embodiment at least a portion of upper opening 56 is elevationally over occluded lower opening 34. Further, the occluding material that occludes the lower opening is removed to form an interconnected opening 62/62a in each embodiment that comprises a now unoccluded lower opening 34. In one embodiment, the occluding material is formed over an elevationally-outermost surface of the lower stack laterally outward of the lower opening, with the upper stack being formed over the occluding material that is laterally outward of the lower opening. In one such embodiment, some of the occluding material that is laterally outward of the lower opening is removed before forming the upper stack over the lower stack, and in one such embodiment most of the occluding material that is laterally outward of the lower opening is removed before forming the upper stack over the lower stack (e.g., the embodiment shown by FIGS. 11-13 where all of material 76 is removed).

An embodiment of the invention encompasses a vertical string of memory cells individually comprising a programmable charge storage transistor comprising a control gate and a charge storage structure independent of method of manufacture. One such example embodiment is shown in FIG. 10 and comprises an upper stack 44 elevationally over a lower stack 24. The upper and lower stacks individually comprise vertically-alternating tiers 26/28 and 46/48, respectively, which comprise vertically-alternating insulating material 32/33 and memory cell material. The memory cell material comprises control gate material 36, control gate insulator 66, and charge storage material 68. A channel pillar 72 which is common to/with upper stack 44 and lower stack 24 extends through multiple of the vertically-alternating tiers in each of the upper and lower stacks and elevationally between the upper and lower stacks. Tunnel insulator 70 is laterally between channel pillar 72 and charge storage material 68. The vertical string of memory cells comprises inoperable charge storage material 68 elevationally between upper stack 44 and lower stack 24 and which surrounds channel pillar 72. Specifically and as an example, the charge storage material 68 that is within intervening projecting portions 64 may not be connected to/with any operable circuit component and thereby be inoperable charge storage material (e.g., contrary to the charge storage material 68 of memory cells 73 which is operable in determining or setting a programmed state of an individual memory cell).

In one embodiment, insulative material 70 is laterally between inoperable charge storage structure material 68 and channel pillar 72 elevationally between upper stack 44 and lower stack 24. In one embodiment, inoperable charge storage material 68 comprises a top 57, a bottom 59, a radially-inner side 61, and a radially-outer side 63. In one embodiment, material of control gate blocking insulator 66 is directly against top 57, bottom 59, and radially-outer side 63. In one such embodiment, insulative material 70 is directly against radially-inner side 61 of inoperable charge storage structure material 68 laterally between such material and channel pillar 72 elevationally between upper stack 44 and lower stack 24. Any other attribute(s) or aspect(s) as shown and/or described above may be used.

Figure 14:
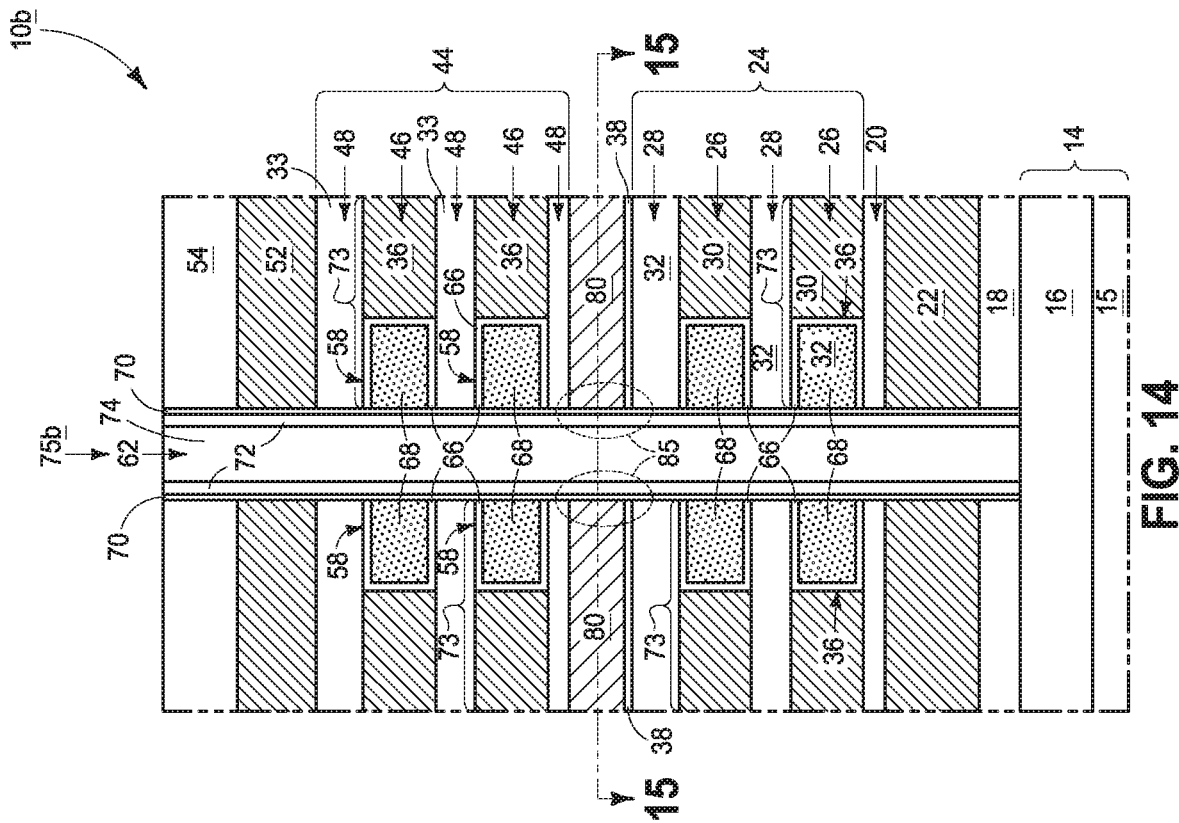
FIG. 14 is a diagrammatic sectional view of a substrate fragment comprising a vertical string of memory cells in accordance with an embodiment of the invention.

An alternate example embodiment vertical string of memory cells individually comprising a programmable charge storage transistor comprising a control gate and a charge storage structure is next described with reference to FIGS. 14 and 15 with respect to a substrate fragment 10b. Like numerals from the above-described embodiments have been used where appropriate, with some construction differences being indicated with the suffix "b" or with different numerals. Example vertical string 75b of memory cells 73 in FIGS. 14 and 15 comprises an upper stack 44 elevationally over a lower stack 24. Upper and lower stacks 44 and 24 individually comprise vertically-alternating tiers 46/48 and 28/26, respectively, comprising vertically-alternating insulating material 32/33 and memory cell material. The memory cell material comprises control gate material 30/36, control gate blocking insulator 66, and charge storage material 68. A channel pillar 72 is common to/with upper stack 44 and lower stack 24 and extends through multiple of the vertically-alternating tiers in each of the upper and lower stacks and elevationally between the upper and lower stacks. Tunnel insulator 70 is laterally between channel pillar 72 and charge storage material 68.

An operable channel conductivity-enhancing dummy gate 80 is elevationally between upper stack 44 and lower stack 24 operably proximate channel pillar 72, with a gate insulator (e.g., material 70) being laterally between dummy gate 80 and channel pillar 72. In this document, a dummy gate is operable to and which increase(s) conductivity of a region of the channel than would otherwise occur in the same region but in the absence of such operating dummy gate, and with the requirement that the dummy gate not be a gate of any memory cell of the vertical string. Dummy gate 80, gate insulator 70, and channel pillar 72 in combination comprise a field effect transistor 85. Such may provide improved operating attributes over other constructions, for example in comparison to the FIGS. 10 and 13 constructions. For example in each of the FIGS. 10 and 13 constructions, the channel is longer between lower stack 24 and upper stack 44 than between individual memory cells intra-stack. An operating dummy gate 80 results in an added transistor in the string between stacks 24 and 44, thus increasing channel conductivity in the string between such stacks.

Figure 16:
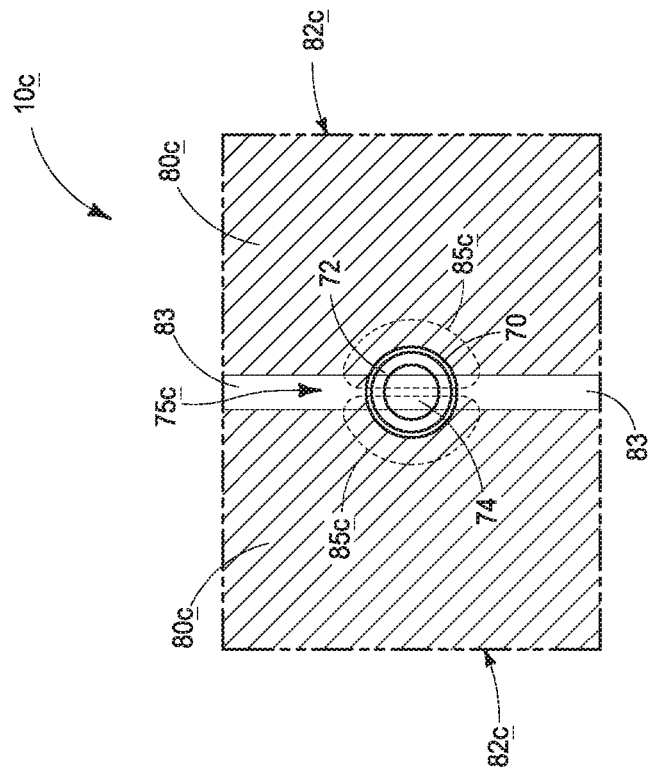
FIG. 16 is a diagrammatic sectional view of a substrate fragment comprising a vertical string of memory cells in accordance with an embodiment of the invention.
Figure 15:
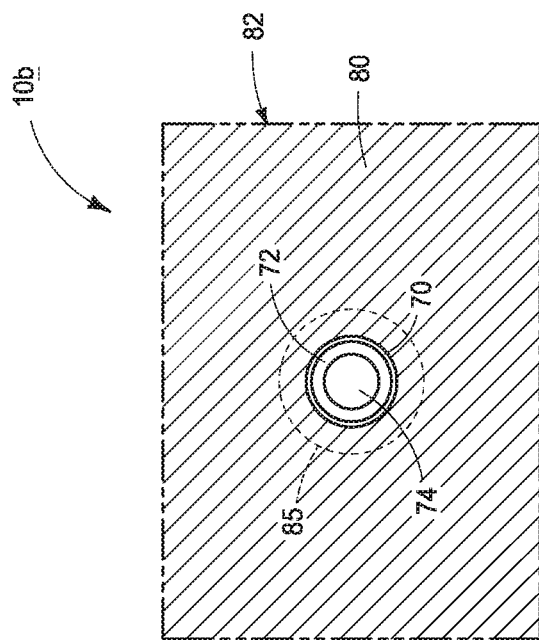
FIG. 15 is a diagrammatic sectional view taken through line 15-15 in FIG. 14.

Dummy gate 80 may completely encircle the gate insulator and channel and thereby comprise a single dummy gate of a single gate line 82 for the vertical string, for example as is apparent in FIG. 15. Alternately as an example, a dummy gate may not completely encircle the gate insulator and channel, and instead form two laterally opposed gate lines of two transistors, for example as shown in an alternate embodiment in FIG. 16. Like numerals from the above-described embodiments have been used where appropriate, with some construction differences being indicated with the suffix "c" or with different numerals. FIG. 16 shows two dummy gates 80c of two gate lines 82c on opposite sides of channel pillar 72, with gate lines 82c being separated by dielectric material 83, and forming two field effect transistors 85c. Dummy gate lines 82c might be operated independently or in tandem.

In one embodiment and as shown, vertical string 75b/75c of memory cells 73 is devoid of any charge storage structure laterally between gate insulator 70 and dummy gate 80/80c elevationally between upper stack 44 and lower stack 24. In one embodiment, tunnel insulator 70 extends elevationally from upper stack 44 to lower stack 24 with material of tunnel insulator 70 comprising the gate insulator that is laterally between dummy gate 80 and channel pillar 72. In one embodiment, channel pillar 72 comprises a hollow channel. Any other attribute(s) or aspect(s) as shown and/or described above may be used.

CONCLUSION

In some embodiments, a method of forming a vertical string of memory cells individually comprising a programmable charge storage transistor comprising a control gate and a charge storage structure comprises forming a lower stack comprising first alternating tiers comprising vertically-alternating control gate material and insulating material having a lower opening extending elevationally through multiple of the first alternating tiers. The lower opening is covered with covering material to form a covered lower void space under the covering material from the lower opening. An upper stack is formed over the lower stack. The upper stack comprises second alternating tiers comprising vertically-alternating control gate material and insulating material having an upper opening extending elevationally through multiple of the second alternating tiers to the covering material, at least a portion of the upper opening being elevationally over the covered lower void space. The covering material is removed to uncover the lower void space to form an interconnected opening comprising the uncovered lower opening and the upper opening. After said removing, charge storage material is deposited into the interconnected opening for the charge storage structures for the memory cells of the vertical string that are in each of the upper and lower stacks and thereafter tunnel insulator and channel material are formed into the interconnected opening for the memory cells of the vertical string that are in each of the upper and lower stacks.

In some embodiments, a method of forming a vertical string of memory cells individually comprising a programmable charge storage transistor comprising a control gate and a charge storage structure comprises forming a lower stack comprising first alternating tiers comprising vertically-alternating control gate material and insulating material having a lower opening extending elevationally through multiple of the first alternating tiers. The lower opening is filled with fill material. An upper stack is formed over the lower stack. The upper stack comprises second alternating tiers comprising vertically-alternating control gate material and insulating material having an upper opening extending elevationally through multiple of the second alternating tiers to the fill material. At least a portion of the upper opening is elevationally over the filled lower opening. The fill material is removed from the lower opening to form an interconnected opening comprising the lower opening and the upper opening. After said removing, charge storage material is deposited into the interconnected opening for the charge storage structures for the memory cells of the vertical string that are in each of the upper and lower stacks and thereafter tunnel insulator and channel material are formed into the interconnected opening for the memory cells of the vertical string that are in each of the upper and lower stacks.

In some embodiments, a method of forming a vertical string of memory cells individually comprising a programmable charge storage transistor comprising a control gate and a charge storage structure comprises forming a lower stack comprising first alternating tiers comprising vertically-alternating control gate material and insulating material. An upper stack is formed over the lower stack. The upper stack comprises second alternating tiers comprising vertically-alternating control gate material and insulating material having an upper opening extending elevationally through multiple of the second alternating tiers. The lower stack comprises a lower opening extending elevationally through multiple of the first alternating tiers and that is occluded by occluding material. At least a portion of the upper opening is elevationally over the occluded lower opening. The occluding material that occludes the lower opening is removed to form an interconnected opening comprising the unoccluded lower opening and the upper opening. After said removing, charge storage material is deposited into the interconnected opening for the charge storage structures for the memory cells of the vertical string that are in each of the upper and lower stacks and thereafter tunnel insulator and channel material are formed into the interconnected opening for the memory cells of the vertical string that are in each of the upper and lower stacks.

In some embodiments, a vertical string of memory cells individually comprising a programmable charge storage transistor comprising a control gate and a charge storage structure comprises an upper stack elevationally over a lower stack. The upper and lower stacks individually comprise vertically-alternating tiers. The vertically-alternating tiers comprise vertically-alternating insulating material and memory cell material. The memory cell material comprises control gate material, control gate blocking insulator, and charge storage material. A channel pillar common to the upper and lower stacks extends through multiple of the vertically-alternating tiers in each of the upper and lower stacks and elevationally between the upper and lower stacks. Tunnel insulator is laterally between the channel pillar and the charge storage material. An operable channel conductivity-enhancing dummy gate is elevationally between the upper and lower stacks operably proximate the channel pillar, gate insulator laterally between the dummy gate and the channel pillar.

In some embodiments, a vertical string of memory cells individually comprising a programmable charge storage transistor comprising a control gate and a charge storage structure comprises an upper stack elevationally over a lower stack. The upper and lower stacks individually comprise vertically-alternating tiers. The vertically-alternating tiers comprise vertically-alternating insulating material and memory cell material. The memory cell material comprises control gate material, control gate blocking insulator, and charge storage material. A channel pillar common to the upper and lower stacks extends through multiple of the vertically-alternating tiers in each of the upper and lower stacks and elevationally between the upper and lower stacks. Tunnel insulator is laterally between the channel pillar and the charge storage material. Inoperable charge storage structure material is elevationally between the upper and lower stacks surrounding the channel pillar.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The subject matter disclosed in U.S. Patent Publication No. 2015/0270280, published Sep. 24, 2015, the subject matter disclosed in U.S. Patent Publication No. 2015/0279855 published Oct. 1, 2015, and the invention claimed herein were made by, or on behalf of, Micron Technology, Inc., Intel Corporation, and IM Flash Technologies, LLC who are parties to a joint research agreement that was in effect on or before the effective filing date of the invention claimed herein. Such invention claimed herein was made as a result of activities undertaken within the scope of that joint research agreement.

The invention claimed is:

1. A vertical string of memory cells individually comprising a programmable charge storage transistor comprising a control gate and a charge storage structure, comprising:
    an upper stack elevationally over a lower stack, the upper and lower stacks individually comprising vertically-alternating tiers, the vertically-alternating tiers comprising vertically-alternating insulating material and memory cell material; the memory cell material comprising control gate material, control gate blocking insulator, and charge storage material;

a channel pillar common to the upper and lower stacks extending through multiple of the vertically-alternating tiers in each of the upper and lower stacks and elevationally between the upper and lower stacks, tunnel insulator laterally between the channel pillar and the charge storage material; and an operable channel conductivity-enhancing dummy gate elevationally between the upper and lower stacks operably proximate the channel pillar, gate insulator laterally between the dummy gate and the channel pillar.

2. The vertical string of memory cells of claim 1 being devoid of any charge storage structure laterally between the gate insulator and the dummy gate elevationally between the upper and lower stacks.

3. The vertical string of memory cells of claim 1 wherein the tunnel insulator extends elevationally from the upper stack to the lower stack with material of the tunnel insulator comprising the gate insulator.

4. The vertical string of memory cells of claim 1 wherein the channel pillar comprises a hollow channel.

5. The vertical string of memory cells of claim 1 comprising two of said operable channel conductivity-enhancing dummy gate on opposite sides of the channel pillar.

6. The vertical string of memory cells of claim 1 wherein the channel pillar has total channel conductivity-modifying dopant(s) present in a quantity no greater than $5 \times 10^{18}$ atoms/cm$^3$.

* * * * *